US008859299B2

(12) United States Patent
Hashim

(10) Patent No.: US 8,859,299 B2
(45) Date of Patent: Oct. 14, 2014

(54) HPC WORKFLOW FOR RAPID SCREENING OF MATERIALS AND STACKS FOR STT-RAM

(71) Applicant: Intermolecular, Inc., San Jose, CA (US)

(72) Inventor: Imran Hashim, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/716,396

(22) Filed: Dec. 17, 2012

(65) Prior Publication Data

US 2014/0170775 A1 Jun. 19, 2014

(51) Int. Cl.
*H01L 21/00* (2006.01)
*H01L 43/12* (2006.01)

(52) U.S. Cl.
CPC ..................... *H01L 43/12* (2013.01)
USPC .................................. 438/3; 438/14

(58) Field of Classification Search
CPC .......... H01L 23/58; H01L 29/82; H01L 21/67
USPC .................. 438/3, 14; 257/48, 421, E29.323, 257/E21.665, E23.179
See application file for complete search history.

(56) References Cited

U.S. PATENT DOCUMENTS

2007/0267631 A1* 11/2007 Weiner et al. ................ 257/48
2011/0303997 A1* 12/2011 Wang et al. ................ 257/421
2013/0258763 A1* 10/2013 Ranjan et al. ................ 365/158

OTHER PUBLICATIONS

Contreras, M., et al.; Improved Energy Conversion Efficiency in Wide Bandgap Cu(In,Ga)Se2 Solar Cells; National Renewable Energy Laboratory, 6 pages, 2012.

Shoji Ikeda, et al; Magnetic Tunnel Junctions for Spintronic Memories and Beyond; May 2007; IEEE Transactions on Electron Devices, vol. 54, No. 5, pp. 991-1002.

Mantovan, R., et al.; Atomic Layer Deposition of Magnetic Thin Films; 2007; Proceedings of the Workshop on Smothing and Characterization of Magnetic Films, vol. 112, No. 6, pp. 1271-1280.

Jackson, Philip, et al; High Quality Baseline for High Efficiency, Cu(In1xGax)Se2 Solar Cells; Mar. 14, 2007; John Wiley & Sons, Ltd.; Progress in Photovoltaics Research and Applications, pp. 507-519.

Jackson, Philip, et al; New world record efficiency for Cu(In,Ga)Se2 thin-film solar cells beyond 20%; Jan. 5, 2011; John Wiley & Sons, Ltd.; Progress in Photovoltaics: Research and Applications, pp. 894-897.

Lundberg, Olle; Band Gap Profiling and High Speed Deposition of Cu(In,Ga)Se2 for Thin Film Solar Cells; Nov. 21, 2003; Comprehensive Summaries of Uppsala Dissertations from the Faculty of Science and Technology, 61 pages.

Dullweber, T. et al.; Study of the effect of gallium grading in Cu(In,Ga)Se2; 2000; Elsevier Science S.A.; Thin Solid Films, pp. 478-481.

Komaki, H., et al.; Fabrication of integrated CIGS modules using the in-line three-stage process; National Institute of Advanced Industrial Science and Technology (AIST), 5 pages, 2009.

\* cited by examiner

*Primary Examiner* — Jarrett Stark
*Assistant Examiner* — Shahed Ahmed

(57) ABSTRACT

In some embodiments, HPC techniques are applied to the screening and evaluating the materials, process parameters, process sequences, and post deposition treatment processes for the development of STT-RAM stacks. Simple test structures are employed for initial screening of basic materials properties of candidate materials for each layer within the stack. The use of multiple site-isolated regions on a single substrate allows many material and/or process conditions to be evaluated in a timely and cost effective manner. Interactions between the layers as well as interactions with the substrate can be investigated in a straightforward manner.

20 Claims, 13 Drawing Sheets

HPC WORKFLOW FOR RAPID SCREENING OF MATERIALS AND STACKS FOR STT-RAM

TECHNICAL FIELD

The present disclosure relates generally to the use of high productivity combinatorial (HPC) techniques for the development of spin-torque transfer random access memory (STT-RAM) stacks.

BACKGROUND

Spin-torque transfer random access memory (STT-RAM) is a promising emerging non-volatile memory (NVM) technology because of its fast read & write times (<10 ns) as well as its potential to have infinite cycling endurance ($>10^{15}$), thus making it a viable candidate to replace not only NVM such as Flash Memory but also dynamic random access memory (DRAM) and static random access memory (SRAM). The key element of this memory is a magnetic tunnel junction (MTJ) which consists of two ferromagnetic (FM) layers (e.g., CoFe, CoFeB, NiFe, and the like) separated by a tunnel barrier layer (e.g., $Al_2O_3$, MgO, and the like). If the tunneling current in this MTJ is spin-polarized current (i.e., with all the injected electrons possessing only one of the two spin states), the resistance of the stack during a short duration or read operation, depends upon whether the magnetization of the two FM layers are parallel or anti-parallel to each other. Typically, the magnetization of one of the FM layers is fixed or "pinned" by antiferromagnetic coupling to a stack (e.g. Ru/IrMn, and the like) whereas the other FM layer is allowed to be "free" (i.e., have either parallel or anti-parallel magnetization). Furthermore, a magnetic field may be required during deposition of the FM layers or post-deposition annealing to align the magnetization orientation in the thin films. The "write" operation can be achieved by passing a pulsed current with spin-polarized electrons through the MTJ, which switches the magnetic orientation of the free FM layer due to a combination of spin-torque transfer and thermal heating at sufficiently high current density (Jc). In addition, the stack may have additional layers such as Ta as a capping layer and also as a seed layer for orienting the texture or grain structure of the subsequent films to enhance the magnetic and electrical properties. Furthermore, additional ferromagnetic layers (e.g. CoPd and NiFe, and the like) may be used to enhance the electron spin-polarization and minimize stray magnetic fields. To form a large memory array consisting of multiple memory cells, the STT-RAM stack needs to be integrated with a current steering element such as a transistor or a diode which allows the bit to pass current through it for read or write operations only when it is "selected", thus minimizing the leakage paths in the memory array.

One of the challenges for STT-RAM is the high current density (Jc) required for "write" operation (i.e., to change the orientation of the "free" FM layer, typically ~100 uA for ~54 nm minimum feature size), which is significantly higher than the write currents for Flash memory. While this current scales with area proportionally, lower currents are required for this technology to be cost competitive. Some of the approaches for this write current reduction include orienting the magnetization of the FM layers perpendicular instead of in the plane of the film. Another challenge for STT-RAM is to have sufficient signal-to-noise for the read operation (i.e., >100 mV sense voltage signal) due to different resistances of the MTJ with parallel or anti-parallel magnetizations or having a high tunnel magnetoresistance (TMR) ratio. Approaches to increase TMR include optimization of the FM layers (e.g., CoFeB), and/or the tunnel barrier layer (e.g., MgO), or having a dual MTJ stack. Thus, there is need for optimization or improvement of the materials and stacks used for STT-RAM.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, HPC techniques are applied to the screening and evaluating the materials, process parameters, process sequences, and post deposition treatment processes for the development of STT-RAM stacks. Simple test structures are employed for initial screening of basic materials properties of candidate materials for each layer within the stack. The use of multiple site-isolated regions on a single substrate allows many material and/or process conditions to be evaluated in a timely and cost effective manner. Interactions between the layers as well as interactions with the substrate can be investigated in a straightforward manner.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
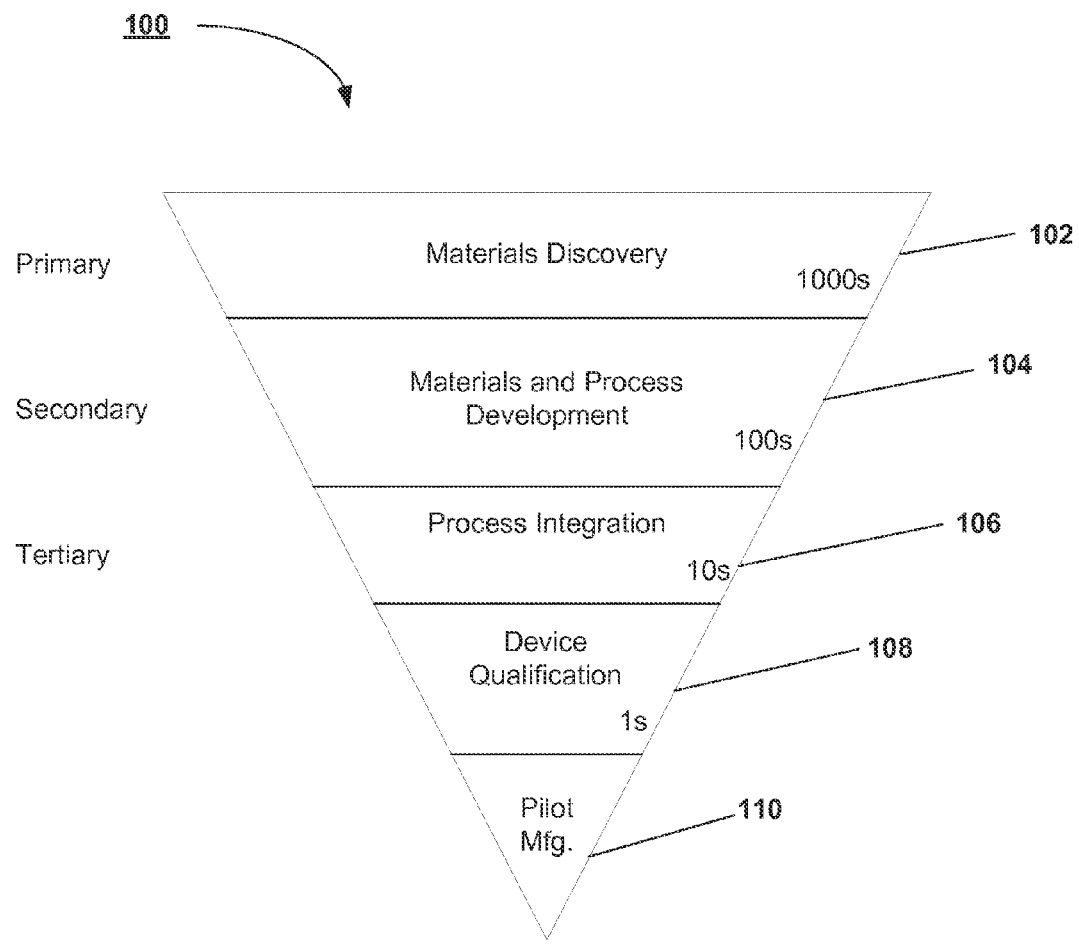
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The terms "about" and "approximately" generally refer to ±10% of a stated value.

As used herein, the term "oxide" refers generally to a compound containing oxygen and at least one other element. The compound may contain a single additional element (e.g., $Al_2O_3$) or it may contain a more complex mixture of two or more additional materials in either stoichiometric or non-stoichiometric ratios. The term "bimetallic oxide" refers to an oxide containing at least two metals and wherein the atomic ratios (metal to metal or metal to oxygen) can be either stoichiometric or non-stoichiometric.

As used herein, the notation $M1_xM2_y$ will be understood to designate the atomic fraction of the two metals (i.e. M1 and M2) in a layer. As an example, "$Co_{60}Fe_{40}$" refers to a layer that includes 60 atomic % Co and 40 atomic 5 Fe.

The manufacture of STT-RAM devices entails the integration and sequencing of many unit processing steps. As an example, STT-RAM manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as STT-RAM devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of STT-RAM devices.

Figure 3:
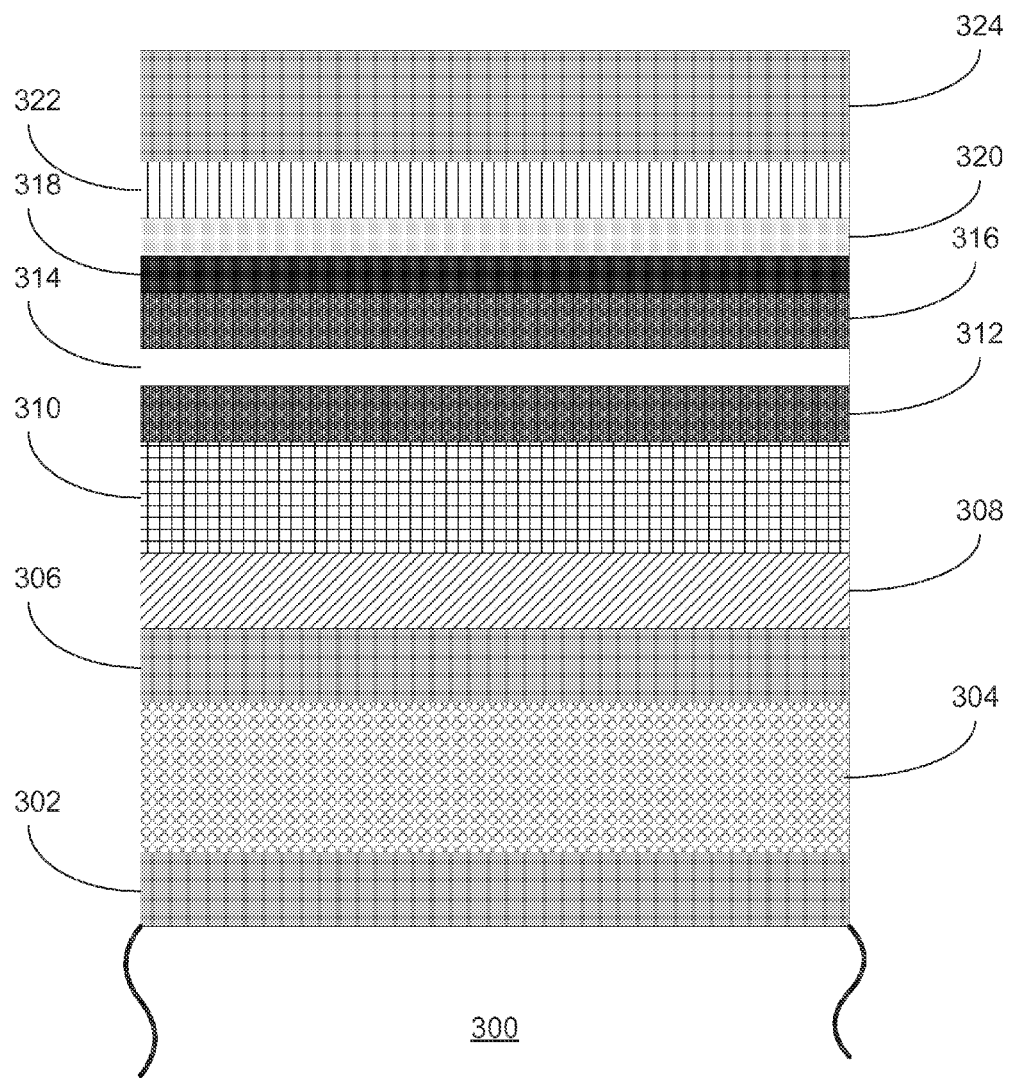
FIG. 3 illustrates a schematic diagram of a simple STT-RAM stack according to some embodiments described herein.
Figure 11:
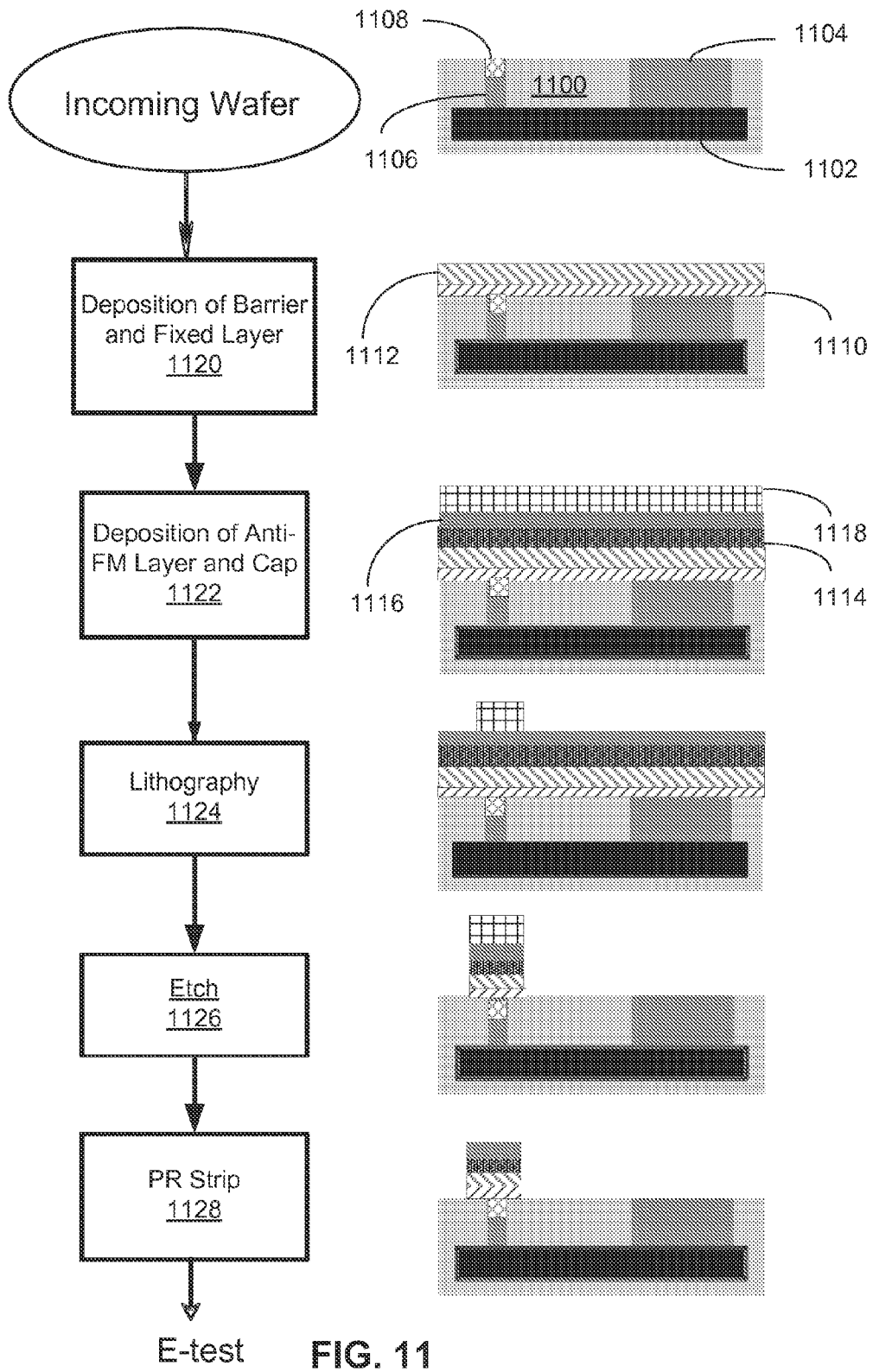
FIG. 11 illustrates a flow diagram for forming a STT-RAM stack according to some embodiments described herein.
Figure 12:
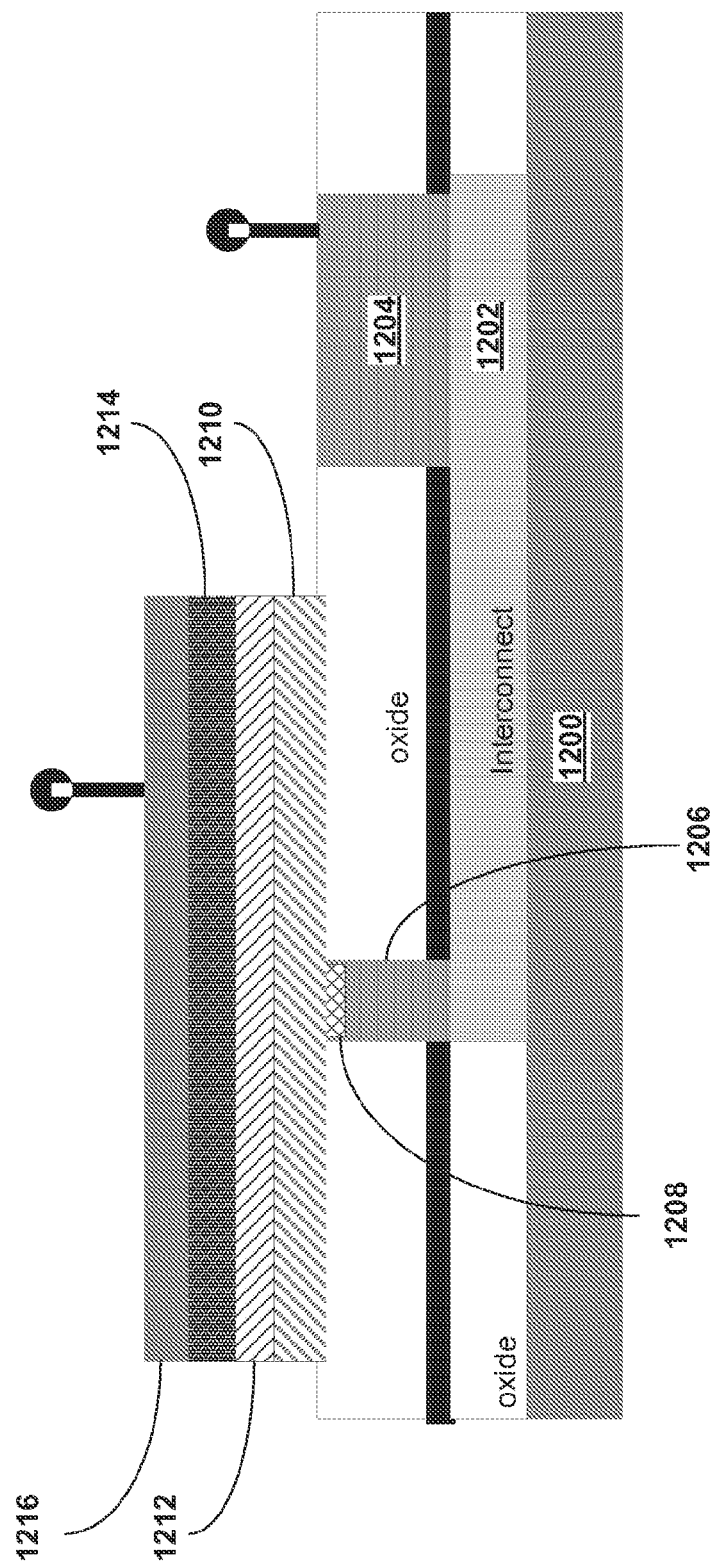
FIG. 12 illustrates a test chip for a STT-RAM stack according to some embodiments described herein.

In FIGS. 3, 11 and 12, a STT-RAM stack is illustrated using a simple planar structure. Those skilled in the art will appreciate that the description and teachings to follow can be readily applied to any simple or complex STT-RAM device morphology. The drawings are for illustrative purposes only and do not limit the application of the present invention.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of STT-RAM manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a STT-RAM device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a STT-RAM device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the STT-RAM device. For example, such structures may include, but would not be limited to, contact layers, buffer layers, absorber layers, or any other series of layers or unit processes that create an intermediate structure found on STT-RAM devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
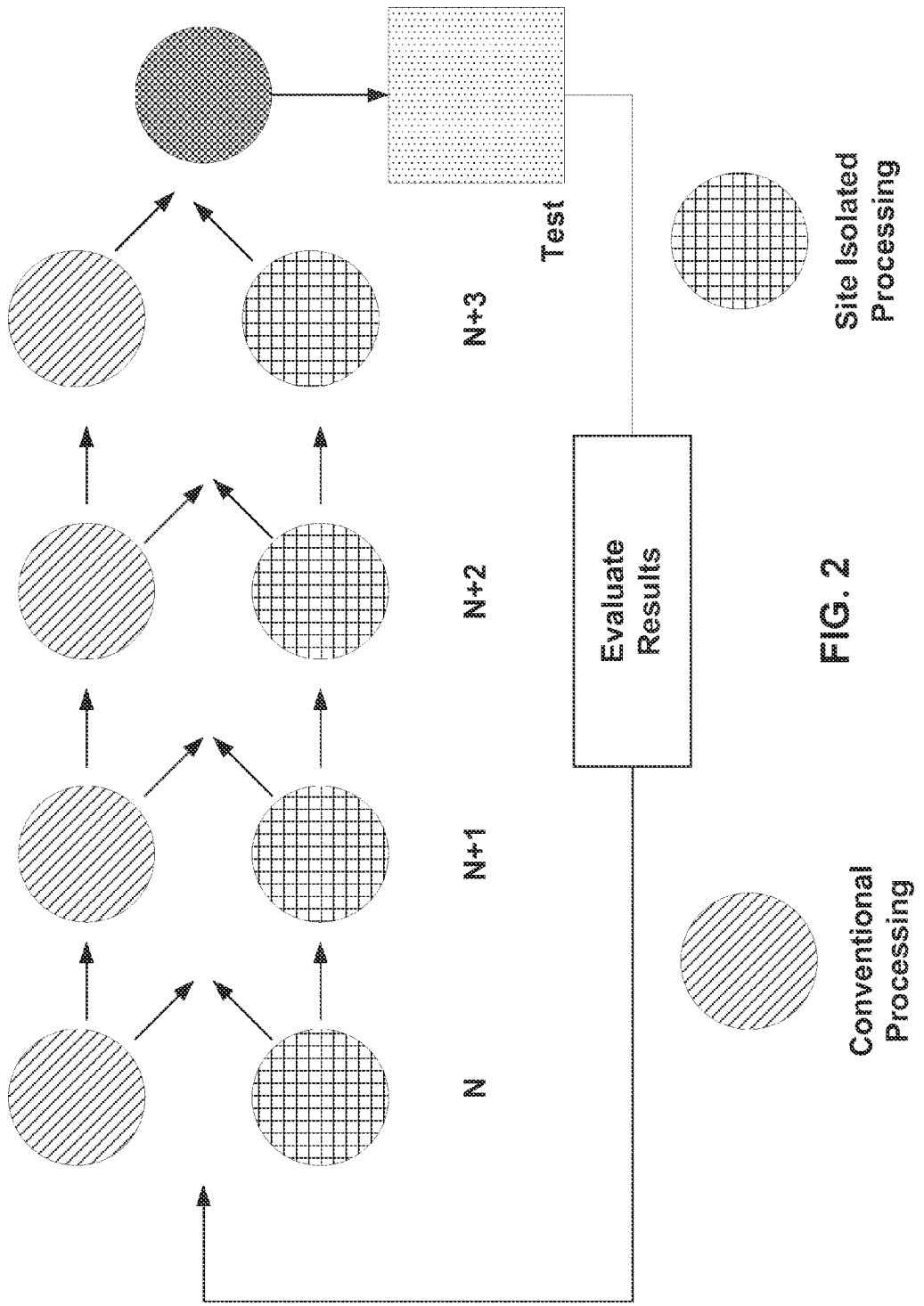
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in STT-RAM manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

FIG. 3 illustrates a schematic diagram of a simple STT-RAM stack according to some embodiments described herein. A substrate, 300, is provided.

A first layer, 302, is formed above the substrate and is operable as a buffer layer. The first layer may include a metal such as Ta. The first layer typically has a thickness between 2 nm and 5 nm.

A second layer, 304, is formed above the first layer and is operable as a contact layer. The second layer may include a metal alloy such as Cu—Al. The second layer typically has a thickness between 40 nm and 60 nm.

A third layer, 306, is formed above the second layer and is operable as a first seed layer. The third layer may include a metal such as Ta that acts as a capping layer for the underlying contact layer and may further include a ferromagnetic material such as NiFeCr. The third layer typically has a thickness between 2 nm and 5 nm.

A fourth layer, 308, is formed above the third layer and is operable as a second seed layer. The fourth layer may include a ferromagnetic material such as NiFeCr. The fourth layer typically has a thickness between 2 nm and 5 nm. The two seed layers (306, 308) serve to orient the texture or grain structure of subsequent films to enhance magnetic and electrical properties.

A fifth layer, 310, is formed above fourth layer and is operable as an antiferromagnet. The fifth layer may include an antiferromagnetic material such as PtMn or IrMn. The fifth layer typically has a thickness between 10 nm and 55 nm. The fifth layer serves to "pin" the magnetization of the subsequent fixed layers.

A sixth layer, 312, is formed above the fifth layer and is operable as a first "fixed" or "pinned" magnetic layer within the MTJ. The sixth layer may include a ferromagnetic material such as $Co_{50}Fe_{50}$. Other examples of suitable materials for the sixth layer include $Co_{90}Fe_{10}$, $Co_{60}Fe_{40}$, $Co_{40}Fe_{40}B_{20}$, $Co_{20}Fe_{60}B_{20}$, $Ni_{50}Fe_{50}$, and the like. The sixth layer typically has a thickness between 2 nm and 3 nm.

A seventh layer, 314, is formed above sixth layer and is operable as an antiferromagnetic layer. The seventh layer may include an antiferromagnetic material such as Ru. The seventh layer typically has a thickness between 0.8 nm and 0.9 nm. The seventh layer cooperates with the fifth layer and serves to "pin" the magnetization of the fixed layers.

An eighth layer, 316, is formed above the seventh layer and is operable as a second "fixed" or "pinned" magnetic layer within the MTJ. The eighth layer may include a ferromagnetic material such as $Co_{60}Fe_{40}$. Other examples of suitable materials for the eighth layer include $Co_{90}Fe_{10}$, $Co_{50}Fe_{50}$, $Co_{40}Fe_{40}B_{20}$, $Co_{20}Fe_{60}B_{20}$, $Ni_{50}Fe_{50}$, and the like. The eighth layer typically has a thickness between 2 nm and 3 nm.

A ninth layer, 318, is formed above the eighth layer and is operable as a tunnel barrier and serves to separate the two "fixed" magnetic layers from the two "free" magnetic layers subsequently formed. The ninth layer may include metal oxides such as MgO or $Al_2O_3$. The ninth layer typically has a thickness between 0.5 nm and 2 nm.

A tenth layer, 320, is formed above the ninth layer and is operable as a first "free" magnetic layer within the MTJ. The tenth layer may include a ferromagnetic material such as $Co_{50}Fe_{50}$. Other examples of suitable materials for the ninth layer include $Co_{90}Fe_{10}$, $Co_{60}Fe_{40}$, $Co_{40}Fe_{40}B_{20}$, $Co_{20}Fe_{60}B_{20}$, $Ni_{50}Fe_{50}$, and the like. The tenth layer typically has a thickness between 0.8 nm and 1.5 nm.

An eleventh layer, 322, is formed above the tenth layer and is operable as a second "free" magnetic layer within the MTJ. The eleventh layer may include a ferromagnetic material such as NiFe. Other examples of suitable materials for the tenth layer include $Co_{90}Fe_{10}$, $Co_{50}Fe_{50}$, $Co_{60}Fe_{40}$, $Co_{40}Fe_{40}B_{20}$, $Co_{20}Fe_{60}B_{20}$, $Ni_{50}Fe_{50}$, and the like. The eleventh layer typically has a thickness between 2 nm and 3 nm.

A twelfth layer, 324, is formed above the eleventh layer and is operable as a capping layer. The twelfth layer may include a metal such as Ta. The twelfth layer typically has a thickness between 5 nm and 15 nm.

Those skilled in the art will understand that each of the layers discussed with reference to FIG. 3 can be deposited using any known technology. Suitable deposition technologies include PVD (e.g. sputtering), atomic layer deposition (ALD), plasma enhanced atomic layer deposition (PEALD), chemical vapor deposition (CVD), plasma enhanced chemical vapor deposition (PECVD), and the like.

Figure 4:
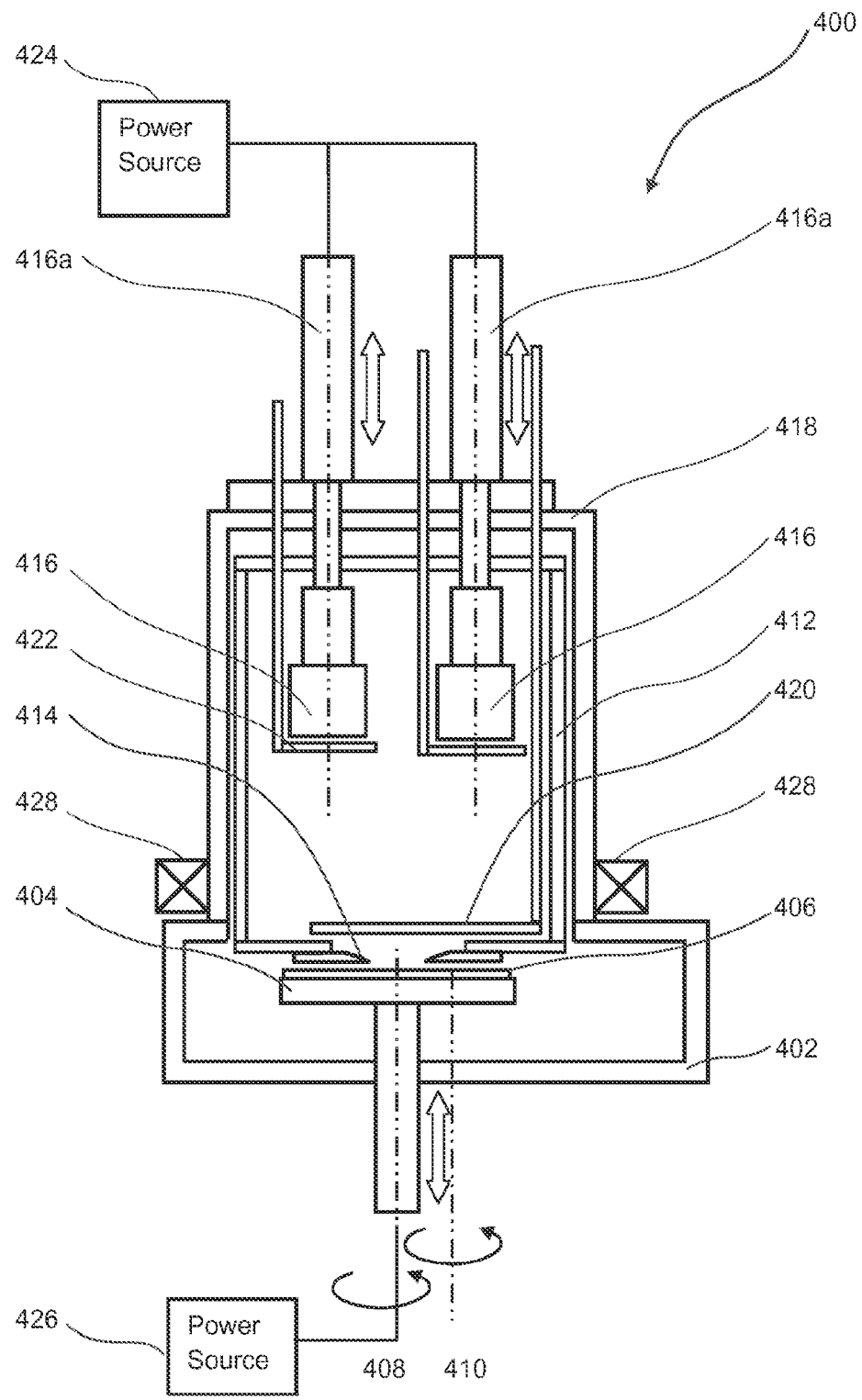
FIG. 4 illustrates a schematic diagram of a combinatorial PVD system according to some embodiments described herein.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a negative bias voltage on substrate 406. In some embodiments power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424. Further details of the power sources and their operation may be found in U.S. patent application Ser. No. 13/281,316 entitled "High Metal Ionization Sputter Gun" filed on Oct. 25, 2011 and is herein incorporated by reference for all purposes.

Substrate 406 may be a conventional round 200 mm, 300 mm, or any other larger or smaller substrate/wafer size. In some embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

A gun shutter, 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments. Power source 424 provides power for sputter guns 416 whereas power source 426 provides RF bias power to an electrostatic chuck to bias the substrate when necessary. It should be appreciated that power source 424 may output a direct current (DC) power supply or a radio frequency (RF) power supply.

Chamber 400 includes auxiliary magnet 428 disposed around an external periphery of the chamber. The auxiliary magnet 428 is located in a region defined between the bottom surface of sputter guns 416 and a top surface of substrate 406. Magnet 428 may be either a permanent magnet or an electromagnet. It should be appreciated that magnet 428 is utilized to provide more uniform bombardment of argon ions and electrons to the substrate in some embodiments.

Figure 5:
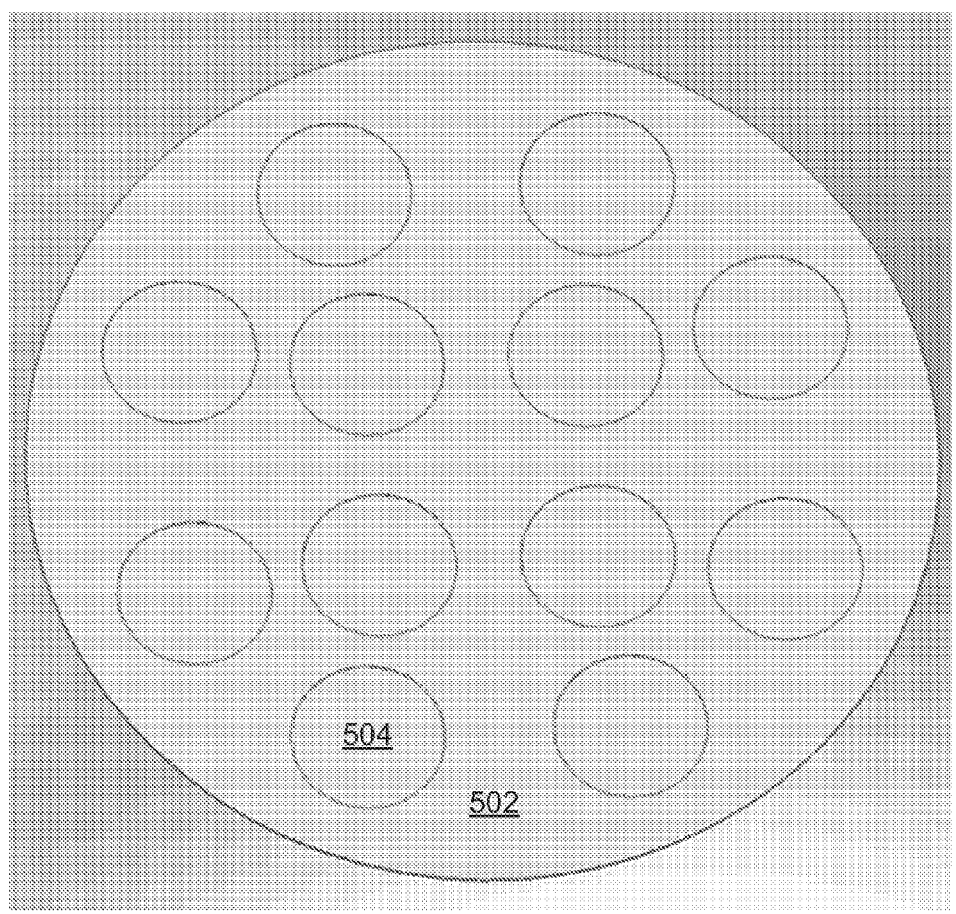
FIG. 5 illustrates a schematic diagram of a substrate that has been processed in a combinatorial manner.

Using a HPC PVD module as illustrated in FIG. 4 allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 5 illustrates one example of a pattern of site-isolated regions that can be processed using a HPC PVD module in accordance with some embodiments. In FIG. 5, the substrate is divided into twelve site-isolated regions, 504, on the substrate, 502. Therefore, in this example, twelve independent experiments could be performed on a single substrate. Those skilled in the art will understand that the twelve site-isolated regions illustrated in FIG. 5 are intended as an example and that any number of site-isolated regions could be formed. The substrate may then be processed through a next step that may be conventional or may also be a combinatorial step as discussed earlier with respect to FIG. 2.

Figure 6:
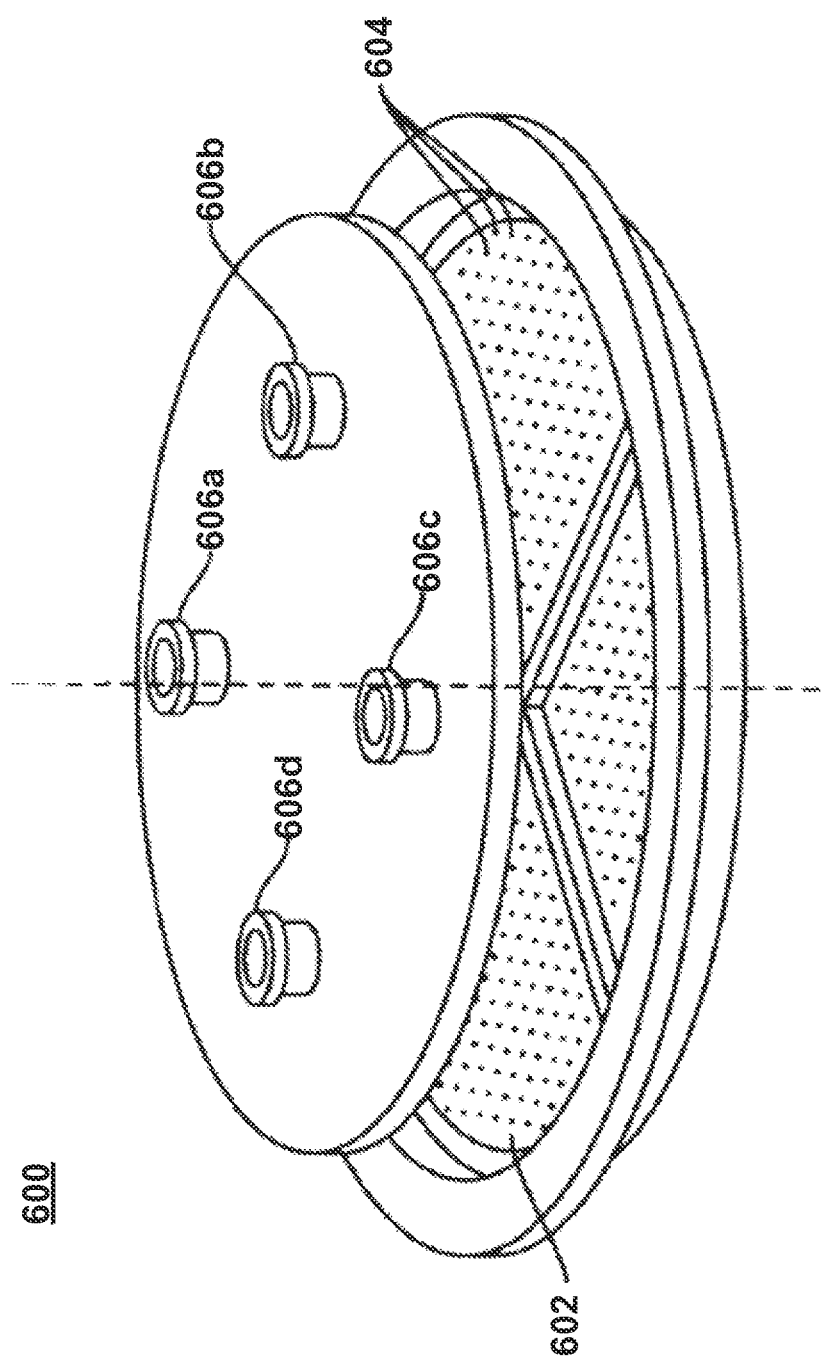
FIG. 6 illustrates a schematic diagram of a combinatorial ALD showerhead according to some embodiments described herein.

FIG. 6 illustrates an example of an ALD or CVD showerhead, 600, used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001, U.S. patent application Ser. No. 12/013,759 entitled "Vapor Based Combinatorial Processing" filed on Jan. 14, 2008 and claiming priority to Provisional Application No. 60/970,199 filed on Sep. 5, 2001, and U.S. patent application Ser. No. 12/205,578 entitled "Vapor Based Combinatorial Processing" filed on Sep. 5, 2008 which is a Continuation application of the U.S. patent application Ser. No. 12/013,729 and claiming priority to Provisional Application No. 60/970,199 filed on Sep. 5, 2001, all of which are herein incorporated by reference.

The ALD or CVD showerhead, 600, illustrated in FIG. 6 comprises four quadrants, 602, used to deposit materials on a substrate. In this example, four quadrants or segments have been illustrated. Those skilled in the art will understand that the showerhead can be divided into any useful number of segments such as 2, 4, 6, 8, or 12 segments. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 606a-606d. For simplicity, the four quadrants, 602, of showerhead, 600, have been illustrated as being a single chamber. Those skilled in the art will understand that each quadrant, 602, of showerhead, 600, may be designed to have two or more isolated gas distribution systems so that multiple reactive gases may be kept separated until they react at the substrate surface. Also for simplicity, on a single gas inlet conduit, 606a-606d, is illustrated for each of the four quadrants. Those skilled in the art will understand that each quadrant, 602, of showerhead, 600, may have multiple gas inlet conduits. The gases exit each quadrant, 602, of showerhead, 600, through holes, 604, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 6 is operable to be used with any of a CVD, PECVD, ALD, or PEALD technology.

Figure 7A:
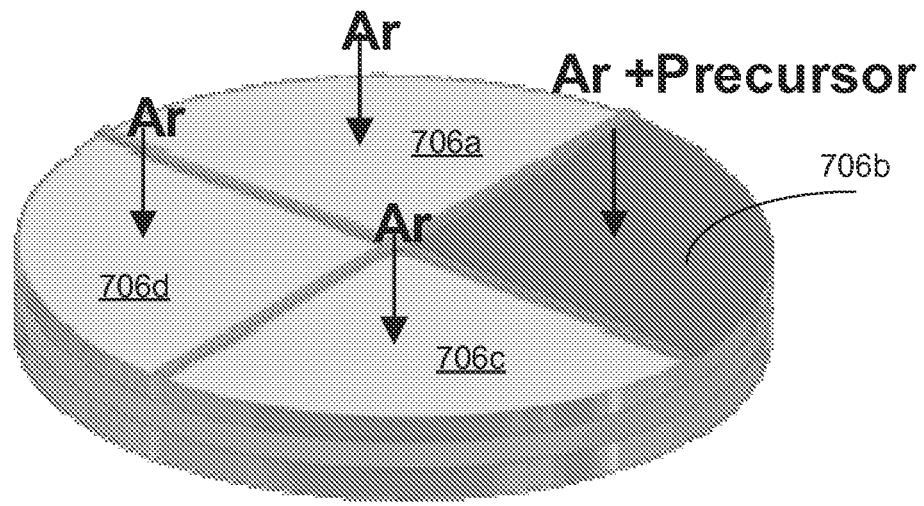
FIGS. 7A and 7B illustrate schematic diagrams of the use of a combinatorial ALD showerhead according to some embodiments described herein.
Figure 7B:
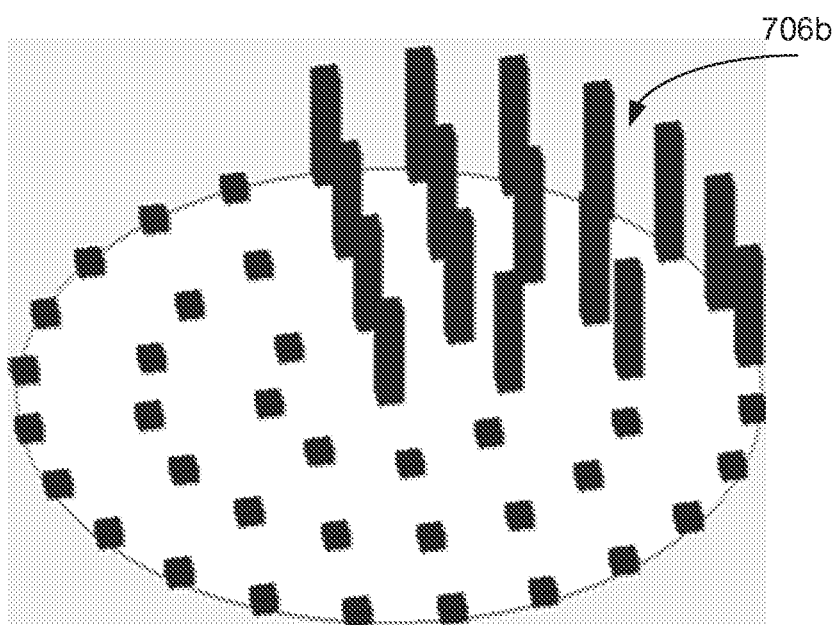

FIGS. 7A and 7B illustrate schematic diagrams of the use of a combinatorial ALD showerhead according to some embodiments described herein. In FIG. 7A, the four quadrants of the showerhead discussed with reference to FIG. 6 are illustrated, 706a-706d. As indicated, three of the quadrants (i.e. 706a, 706c, and 706d) have only Ar flowing through them. Therefore, there would not be any deposition on the substrate under these three quadrants. As indicated, quadrant 706b has Ar and one or more deposition precursors flowing through it. Therefore, a material would be deposited on the substrate under this quadrant. The process parameters can be varied among the four quadrants. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 7B illustrates the resulting thickness profile of the deposited material on the substrate using the showerhead configuration discussed with reference to FIG. 7A. The height of the bars corresponding to quadrant 706b in FIG. 7A indicates that a film was deposited under this portion of the showerhead. Meanwhile, there is no discernable deposition in quadrants 706a, 706c, and 706d. These figures illustrate how the segmented showerhead as discussed with reference to FIG. 6 can be used for combinatorial processing of regions of the substrate.

Figure 8:
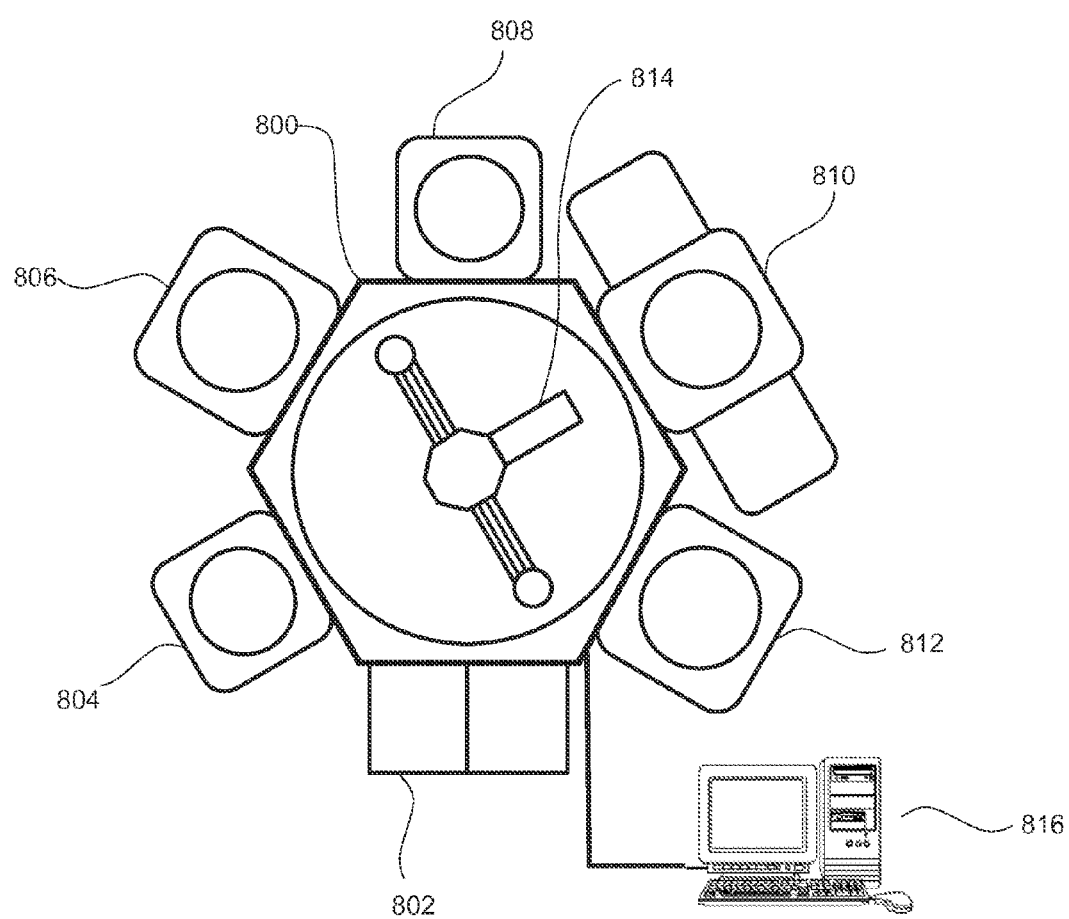
FIG. 8 illustrates a schematic diagram of a cluster system according to some embodiments described herein.

FIG. 8 is a simplified schematic diagram illustrating an integrated high productivity combinatorial (HPC) system in accordance with some embodiments of the invention. HPC system includes a frame 800 supporting a plurality of processing modules. It should be appreciated that frame 800 may be a unitary frame in accordance with some embodiments. In some embodiments, the environment within frame 800 is controlled. Load lock/factory interface 802 provides access into the plurality of modules of the HPC system. Robot 814 provides for the movement of substrates (and masks) between the modules and for the movement into and out of the load lock 802. Modules 804-812 may be any set of modules and preferably include one or more combinatorial modules. For example, module 804 may be an orientation/degassing module, module 806 may be a clean module, either plasma or non-plasma based, modules 808 and/or 810 may be combinatorial/conventional dual purpose modules. Module 812 may provide conventional clean or degas as necessary for the experiment design. In some embodiments, the modules include one or more combinatorial PVD modules. In some embodiments, the modules include one or more combinatorial ALD modules.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 816, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 9C:
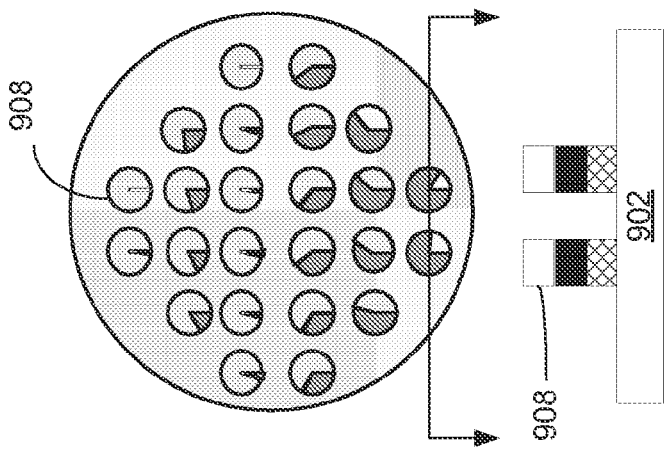
FIGS. 9A-9C are schematic diagrams illustrating various process sequences using combinatorial processing.
Figure 9B:
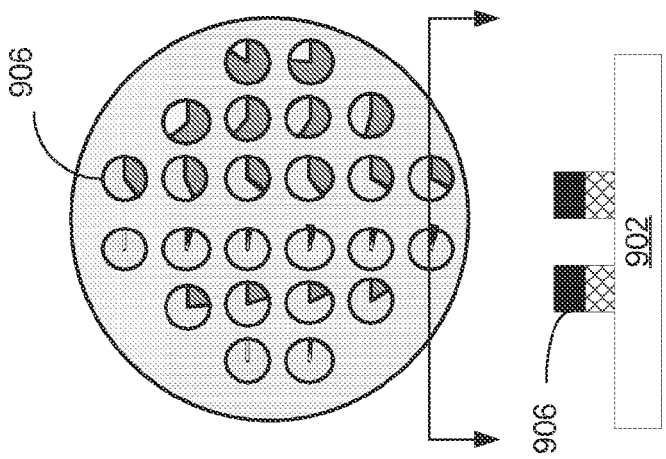
Figure 9A:
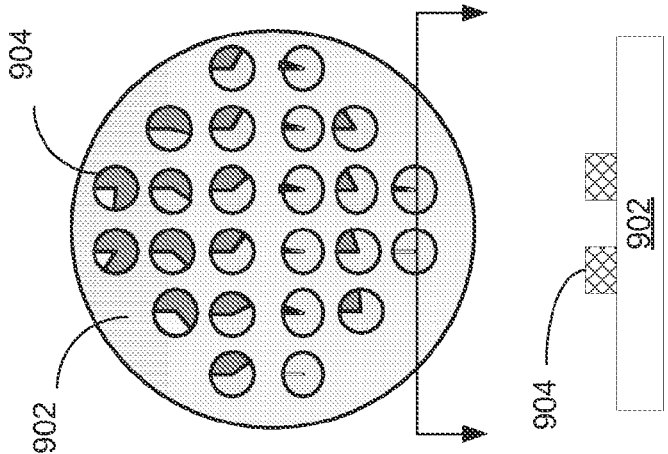

FIGS. 9A-9C are schematic diagrams illustrating various process sequences using combinatorial processing. Specifically, FIGS. 9A-9C are schematic diagrams illustrating the deposition of multilayer films using a HPC PVD module as discussed with respect to FIG. 4. In FIG. 9A, a first layer, 904, is formed on a plurality of site-isolated regions defined on substrate, 902. In FIGS. 9A-9C, twenty-four site-isolated regions are illustrated. However, as discussed previously, any useful number of site-isolated regions can be defined on the substrate. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. In some embodiments, the layer, 904, deposited in FIG. 9A may be operable as one or more of the "pinned" magnetic layers as discussed with reference to FIG. 3, (i.e. the sixth and/or the eighth layers).

In FIG. 9B, a second layer, 906, is formed on the plurality of site-isolated regions defined on substrate, 902. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. In some embodiments, the layer, 906, deposited in FIG. 9B may be operable as the tunnel barrier layer as discussed with reference to FIG. 3, (i.e. the ninth layer). Those skilled in the art will understand that the combinations of the first layers, 904, and the second layers, 906, allow the interactions between the layers to be investigated across a wide range of process conditions.

In FIG. 9C, a second layer, 908, is formed on the plurality of site-isolated regions defined on substrate, 902. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. In some embodiments, the layer, 908, deposited in FIG. 9C may be operable as one or more of the "free" magnetic layers as discussed with reference to FIG. 3, (i.e. the tenth and/or the eleventh layers). Those skilled in the art will understand that the combinations of the first layers, 904, the second layers, 906, and the third layers, 908, allow the interactions between the layers to be investigated across a wide range of process conditions. In some embodiments, the tunneling resistance and the magneto-resistance of the stacks of layers may be evaluated without further patterning steps beyond the physical masking discussed above. An example of metrology for this evaluation is offered by Capres A/S having its headquarters in Denmark.

Figure 10C:
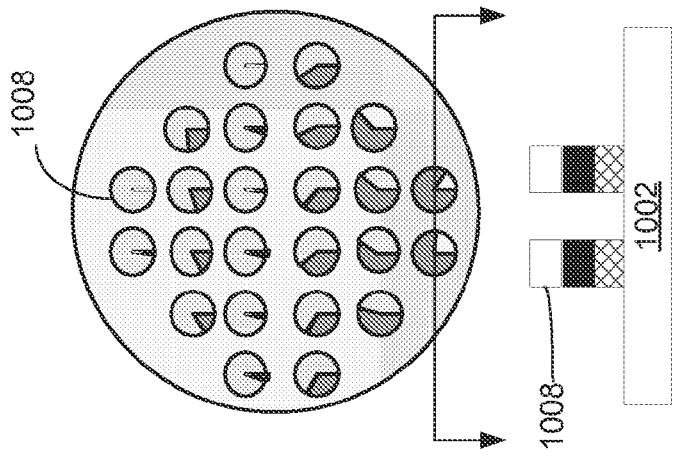
FIGS. 10A-10C are schematic diagrams illustrating various process sequences using combinatorial processing and evaluation.
Figure 10B:
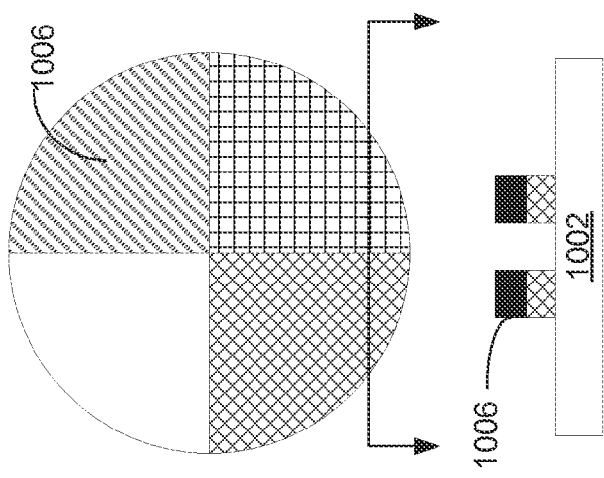
Figure 10A:
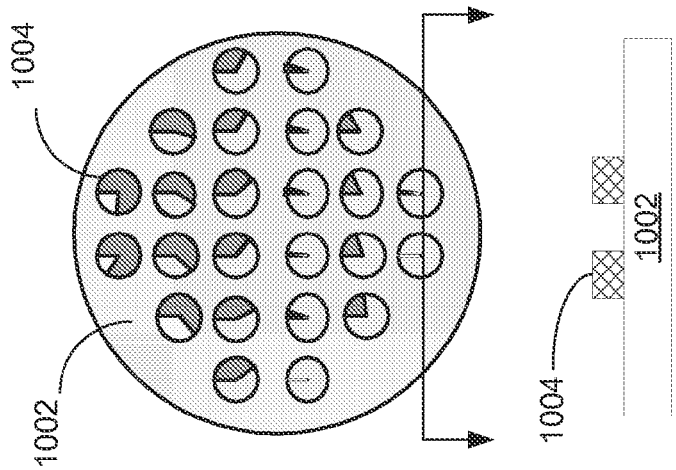

FIGS. 10A-10C are schematic diagrams illustrating various process sequences using combinatorial processing. Specifically, FIGS. 10A-10C are schematic diagrams illustrating the deposition of multilayer films using a combination of HPC PVD modules as discussed with respect to FIG. 4, and HPC ALD modules as discussed with respect to FIGS. 6 and 7. In FIG. 10A, a first layer, 1004, is formed on a plurality of site-isolated regions defined on substrate, 1002 using a HPC PVD process as discussed previously. In FIGS. 10A and 10C, twenty-four site-isolated regions are illustrated. However, as discussed previously, any useful number of site-isolated regions can be defined on the substrate. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. In some embodiments, the layer, 1004, deposited in FIG. 10A may be operable as one or more of the "pinned" magnetic layers as discussed with reference to FIG. 3, (i.e. the sixth and/or the eighth layers).

In FIG. 10B, a second layer, 1006, is formed on the plurality of site-isolated regions defined on substrate, 1002, using a HPC ALD process as discussed previously. In FIG. 10B, four regions are illustrated. However, as discussed previously, any useful number of regions can be defined on the substrate. As illustrated by the different shading among the various regions, one or more process parameters can be varied among the regions in a combinatorial manner. For ALD deposition techniques, example of process parameters that can be varied include material composition, pressure, substrate temperature, precursor gas composition, precursor gas concentration, precursor gas pulse time, reactive gas composition, reactive gas concentration, reactive gas pulse time, gas flow rate, and the like. In some embodiments, the layer, 1006, deposited in FIG. 10B may be operable as the tunnel barrier layer as discussed with reference to FIG. 3, (i.e. the ninth layer). Those skilled in the art will understand that the combinations of the first layers, 1004, and the second layers, 1006, allow the interactions between the layers to be investigated across a wide range of process conditions.

In FIG. 10C, a second layer, 1008, is formed on the plurality of site-isolated regions defined on substrate, 1002. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. In some embodiments, the layer, 1008, deposited in FIG. 10C may be operable as one or more of the "free" magnetic layers as discussed with reference to FIG. 3, (i.e. the tenth and/or the eleventh layers). Those skilled in the art will understand that the combinations of the first layers, 1004, the second layers, 1006, and the third layers, 1008, allow the interactions between the layers to be investigated across a wide range of process conditions. In some embodiments, the tunneling resistance and the magneto-resistance of the stacks of layers may be evaluated without further patterning steps beyond the physical masking discussed above. An example of metrology for this evaluation is offered by Capres A/S having its headquarters in Denmark.

FIG. 11 illustrates a flow diagram for forming a STT-RAM stack according to some embodiments described herein. In FIG. 11, an incoming wafer, 1100, can be designed and purchased from a commercial vendor. The incoming wafer contains test structures that include an interconnect structure, 1102, a test pad, 1104, vias, 1106, and one or more of the "free" magnetic layers, 1108, as discussed previously. The test structures can be manufactured using well established semiconductor processing techniques. Therefore, the contact area of the free magnetic layer, 1108, is well defined and well controlled. Those skilled in the art will understand that one or more test structures would be formed in each of the site-isolated regions described previously.

In step 1120, the tunnel barrier layer, 1110, and the one or more "fixed" magnetic layers, 1112, are deposited. These layers may be deposited using HPC PVD or HPC ALD deposition techniques as discussed previously. Therefore, these layers may be deposited on each of the site-isolated regions and the processing parameters of each layer can be varied in a combinatorial manner across the site-isolated regions.

In step 1122, the antiferromagnetic layer, 1114, the capping layer, 1116, and a photoresist layer, 1118, are deposited. Layers 1114 and 1116 may be deposited using HPC PVD or HPC ALD deposition techniques as discussed previously. Therefore, these layers may be deposited on each of the site-isolated regions and the processing parameters of each layer can be varied in a combinatorial manner across the site-isolated regions. The photoresist layer, 1118, is deposited using typical spin-coating techniques.

In step 1124, the photoresist layer is patterned using typical exposure and develop techniques. Because the effective area of the STT-RAM device will be determined by the area of the free magnetic layer, 1108, the definition of the area defined in the photoresist layer, 1118, is not critical and simple, inexpensive exposure techniques (e.g. contact printing) can be used. The use of simple photolithography techniques increases the throughput of the testing operation and lowers the expense.

In step 1126, the multi-layer stack (i.e. layers 1116, 1114, 1112, and 1110) is patterned using typical etch techniques such as wet etching or plasma etching. As discussed previously, the etch is not a critical operation since the effective area of the STT-RAM device will be determined by the area of the free magnetic layer, 1108.

In step 1128, the photoresist mask, 1118, is removed to expose the capping layer, 1116. The capping layer will be used as one of the electrodes for the STT-RAM device. Those skilled in the art will understand that steps 1120 through 1128 are simple operations that can be performed in a development environment without the long processing times and expense of operations requiring tight control over the critical dimensions. Yet, the results obtained from the activities results in high quality data since the effective area is defined by the area of the free layer, 1108, formed on the incoming wafer.

FIG. 12 illustrates a test chip for a STT-RAM stack according to some embodiments described herein. FIG. 12 presents a more detailed illustration of the test chip at the end of the processing sequence discussed with reference to FIG. 11. As discussed previously, one or more test chips would be present in each of the site-isolated regions define on the substrate and used for combinatorial experimentation. The test chip illustrated in FIG. 12 includes an interconnect structure, 1202, a test pad, 1204, vias, 1206, and one or more of the "free" magnetic layers, 1208, as discussed previously. The test structures can be manufactured using well established semiconductor processing techniques. Therefore, the contact area of the free magnetic layer, 1208, is well defined and well controlled. The tunnel barrier layer, 1210, and the one or more "fixed" magnetic layers, 1212, are deposited above the free layer, 1208. These layers may be deposited using HPC PVD or HPC ALD deposition techniques as discussed previously. Therefore, these layers may be deposited on each of the site-isolated regions and the processing parameters of each layer can be varied in a combinatorial manner across the site-isolated regions. The antiferromagnetic layer, 1214, and the capping layer, 1216, are deposited above the fixed magnetic layer, 1212. Layers 1214 and 1216 may be deposited using HPC PVD or HPC ALD deposition techniques as discussed previously. Therefore, these layers may be deposited on each of the site-isolated regions and the processing parameters of each layer can be varied in a combinatorial manner across the site-isolated regions. As discussed with reference to the processing sequence outlined in FIG. 11, the STT-RAM stack is patterned to provide the test chip illustrated in FIG. 12. Probes placed on the test pad, 1204, and the patterned capping layer, 1216, allow the electrical properties and the performance of the STT-RAM stack to be characterized. The results of the tests evaluated across the many combinations present in the various site-isolated regions allow the materials and processing conditions to be selected for good overall device performance.

Figure 13:
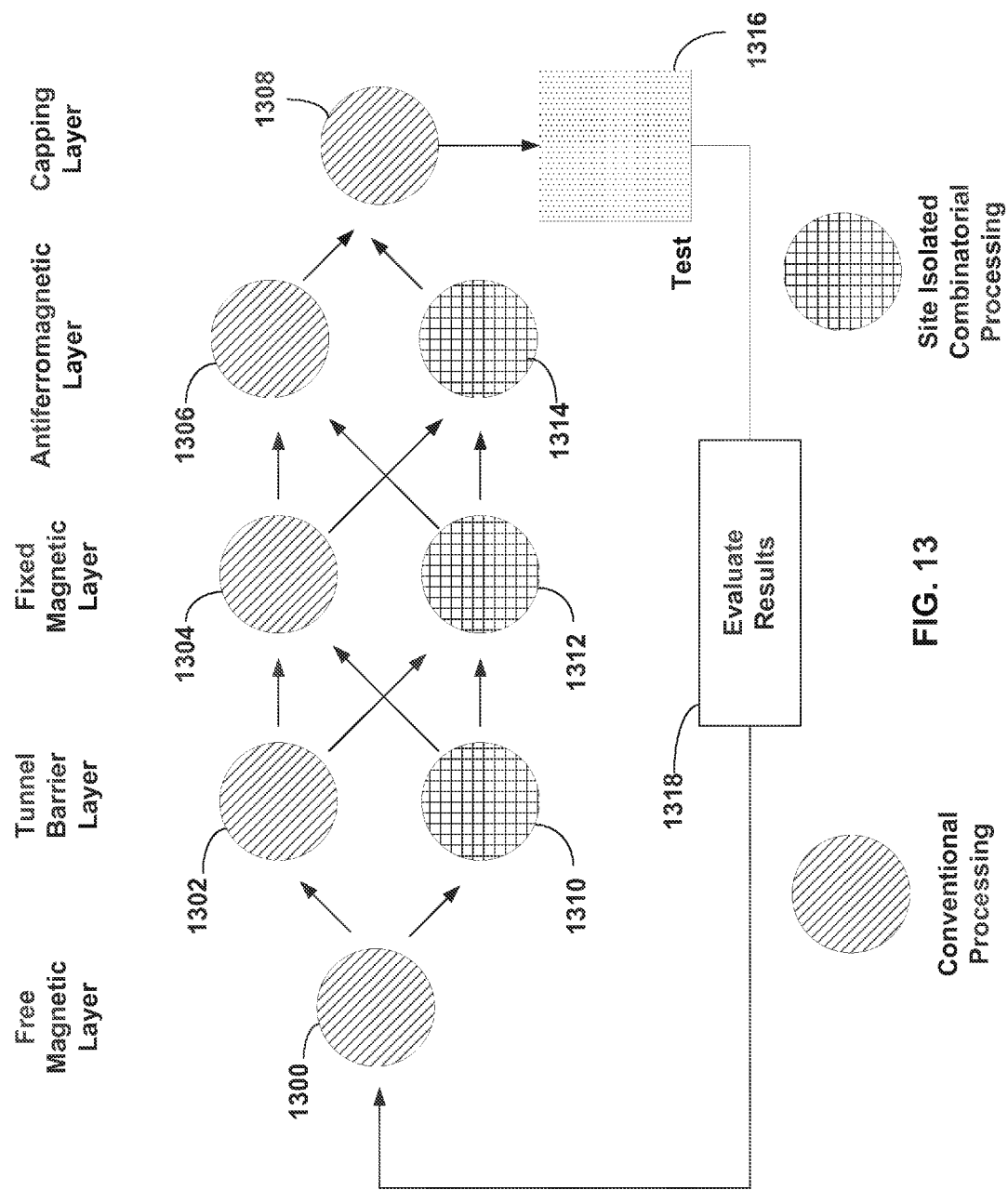
FIG. 13 illustrates a flow diagram for forming a STT-RAM stack according to some embodiments described herein.

FIG. 13 illustrates a diagram of potential process sequences for forming a simple STT-RAM stack according to some embodiments. As discussed previously, several of the layers provide opportunities to apply combinatorial techniques to the development and investigation of the materials and treatments for the layers. For STT-RAM stacks, candidate layers include the free and/or fixed magnetic layers, the antiferromagnetic layer, and the tunnel barrier layer, among others.

Examples of suitable free and/or fixed magnetic layers include $Co_{90}Fe_{10}$, $Co_{60}Fe_{40}$, $Co_{50}Fe_{50}$, $Co_{40}Fe_{40}B_{20}$, $Co_{20}Fe_{60}B_{20}$, $Ni_{50}Fe_{50}$, and the like. $Co_{50}Fe_{50}$ is the material most often used as the free and/or fixed magnetic layer in STT-RAM devices. The material composition of the free and/or fixed magnetic layer may be varied in a combinatorial manner. The free and/or fixed magnetic layer may be deposited using PVD. The deposition of the free and/or fixed magnetic layer by PVD may be investigated using HPC techniques by varying process parameters such as material composition, power, pressure, substrate temperature, substrate bias, target-to-substrate distance, reactive gas concentration, gas flow rate, co-sputtering versus nanolaminate deposition, and the like. These are meant to be illustrative parameters and those skilled in the art will be able to apply HPC techniques to any of the commonly used process parameters.

A second layer that may be investigated using HPC techniques includes the tunnel barrier layer. The material composition and/or the processing parameters of the tunnel barrier layer may be varied in a combinatorial manner. The tunnel barrier layer may be formed using a variety of techniques such as PVD, or ALD, etc. The deposition of the tunnel barrier layer by PVD may be investigated using HPC techniques by varying process parameters such as material composition, power, pressure, substrate temperature, substrate bias, target-to-substrate distance, reactive gas concentration, gas flow rate, co-sputtering versus nanolaminate deposition, and the like. These are meant to be illustrative parameters and those skilled in the art will be able to apply HPC techniques to any of the commonly used process parameters. The deposition of the tunnel barrier layer by ALD may be investigated using HPC techniques by varying process parameters such as material composition, pressure, substrate temperature, precursor gas composition, precursor gas concentration, precursor gas pulse time, reactive gas composition, reactive gas concentration, reactive gas pulse time, gas flow rate, and the like. These are meant to be illustrative parameters and those skilled in the art will be able to apply HPC techniques to any of the commonly used process parameters.

A third layer that may be investigated using HPC techniques includes the antiferromagnetic layer. Examples of suitable back contact interface layer materials comprise PtMn or IrMn, and the like. The material composition and/or the processing parameters of the antiferromagnetic layer may be varied in a combinatorial manner. Typically, PVD is the preferred method of deposition for the antiferromagnetic layer. The deposition of the antiferromagnetic layer by PVD may be investigated using HPC techniques by varying process parameters such as material composition, power, pressure, substrate temperature, substrate bias, target-to-substrate distance, reactive gas concentration, gas flow rate, co-sputtering versus nanolaminate deposition, and the like.

Returning to FIG. 13, through the use of a combination of conventional and combinatorial processing systems (i.e. systems capable of processing multiple isolated regions on a single substrate) a number of trajectories through the various systems illustrated in the flow diagram of FIG. 13 can be envisioned. In FIG. 13, the free magnetic layer may be deposited in a conventional processing manner, 1300, as part of the test chip substrate as discussed previously. As discussed previously, the tunnel barrier layer may be deposited in a conventional processing manner, 1302, or in a site isolated combinatorial processing manner, 1310. As discussed previously, the fixed magnetic layer may be deposited in a conventional processing manner, 1304, or in a site isolated combinatorial processing manner, 1312. As discussed previously, the antiferromagnetic layer may be deposited in a conventional processing manner, 1306, or in a site isolated combinatorial processing manner, 1314. The capping layer may be deposited in a conventional processing manner, 1308, since the capping layer is well characterized for STT-RAM devices. After the deposition of the various layers and subsequent processing, the various devices represented by each of the site isolated regions may be tested in step 1316, and the results evaluated in step, 1318. As discussed previously, the results will form the basis for additional cycles of investigation through HPC techniques to identify materials and process conditions that increase the performance of the STT-RAM device.

Using the simple diagram in FIG. 13, there are eight possible trajectories through the process sequence. These eight trajectories encompass all of the possible combinations of conventional and combinatorial processing illustrated. Those skilled in the art will understand that HPC techniques may be applied to other processes, not illustrated, such as anneal treatments, cleaning, etching, surface treatments, surface functionalization, etc. As more variable process steps are included, the total number of required experiments increases dramatically. This illustrates the benefits of using HPC techniques to limit the number of substrates to a manageable number and minimize the cost of the development program. The eight possible trajectories through the process sequence are listed in Table 1 below using the process step identifiers from FIG. 13:

TABLE 1

| Free Magnetic Layer | Tunnel Barrier Layer | Fixed Magnetic Layer | Anti-ferromagnetic Layer | Capping Layer |
|---|---|---|---|---|
| 900 | 902 | 904 | 906 | 908 |
| 900 | 902 | 904 | 914 | 908 |
| 900 | 902 | 912 | 906 | 908 |
| 900 | 902 | 912 | 914 | 908 |
| 900 | 910 | 904 | 906 | 908 |
| 900 | 910 | 904 | 914 | 908 |
| 900 | 910 | 912 | 906 | 908 |
| 900 | 910 | 912 | 914 | 908 |

Therefore, methods of using HPC methodologies applied to the development of STT-RAM devices have been described. The methods make use of the ability to vary materials, process parameters, process sequences, and post deposition treatment processes across multiple site-isolated regions on a substrate in a combinatorial manner using both conventional processing modules as well as combinatorial processing modules.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for developing a STT-RAM stack in a combinatorial manner, the method comprising:
   providing a substrate,
      wherein the substrate comprises a plurality of site-isolated regions defined thereon; and
      wherein each site-isolated region comprises one or more test structures;
   depositing a first layer on each of the site-isolated regions,
      wherein the first layer is operable as a tunnel barrier layer;
   depositing a second layer above the first layer on each of the site-isolated regions,
      wherein the second layer is operable as a fixed magnetic layer;
   depositing a third layer above the second layer on each of the site-isolated regions,
      wherein the third layer is operable as an antiferromagnetic layer;
      wherein at least one process parameter for the depositing of at least one of the first layer, the second layer, or the third layer is varied in a combinatorial manner between each of the site-isolated regions; and
      wherein at least one of the first layer, the second layer, or the third layer is deposited using a high productivity combinatorial atomic layer deposition (ALD) technique or a high productivity combinatorial physical vapor deposition (PVD) technique.

2. The method of claim 1, wherein the first layer comprises at least one of MgO or $Al_2O_3$.

3. The method of claim 1, wherein the first layer is deposited using the high productivity combinatorial PVD technique, and wherein the at least one of the process parameters for depositing the first layer is varied in the combinatorial manner between each of the site-isolated regions.

4. The method of claim 3, wherein the at least one of the process parameter comprises material composition, power, pressure, substrate temperature, substrate bias, target-to-substrate distance, reactive gas concentration, gas flow rate, or co-sputtering versus nanolaminate deposition.

5. The method of claim 1, wherein the first layer is deposited using the high productivity combinatorial ALD technique, and wherein the at least one process parameter for depositing the first layer is varied in the combinatorial manner between each of the site-isolated regions.

6. The method of claim 5, wherein the at least one process parameter comprises material composition, pressure, substrate temperature, precursor gas composition, precursor gas concentration, precursor gas pulse time, reactive gas composition, reactive gas concentration, reactive gas pulse time, or gas flow rate.

7. The method of claim 1, wherein the second layer comprises at least one of $Co_{90}Fe_{10}$, $Co_{60}Fe_{40}$, $Co50Fe_{50}$, $Co_{40}Fe_{40}B_{20}$, $Co_{20}Fe_{60}B_{20}$, or $Ni_{50}Fe_{50}$.

8. The method of claim 1 wherein the second layer is deposited using the high productivity combinatorial PVD technique, and wherein the at least one process parameter for depositing the second layer is varied in the combinatorial manner between each of the site-isolated regions.

9. The method of claim 8, wherein the at least one process parameter comprises material composition, power, pressure, substrate temperature, substrate bias, target-to-substrate distance, reactive gas concentration, gas flow rate, or co-sputtering versus nanolaminate deposition.

10. The method of claim 1, wherein the third layer comprises at least one of PtMn or IrMn.

11. The method of claim 1, wherein the third layer is deposited using the high productivity combinatorial PVD technique, and wherein the at least one parameter for depositing the third layer is varied in the combinatorial manner between each of the site-isolated regions.

12. The method of claim 11, wherein the at least one process parameter comprises material composition, power, pressure, substrate temperature, substrate bias, target-to-substrate distance, reactive gas concentration, gas flow rate, or co-sputtering versus nanolaminate deposition.

13. The method of claim 1, further comprising depositing a capping layer on the third layer.

14. The method of claim 13, further comprising patterning the first layer, the second layer, the third layer, and the capping layer to form a structure above the one or more test structures within each site-isolated region.

15. The method of claim 14, further comprising characterizing the structure above the one or more test structures within each site-isolated region.

16. The method of claim 1, wherein a composition of the second layer is varied in the combinatorial manner between each of the site isolated regions.

17. The method of claim 1, wherein each of the one or more test structures in each site-isolated region comprises a test pad, a via, a interconnect structure connecting the test pad to the via, and a magnetic layer disposed over the via.

18. The method of claim 17, wherein the first layer, the second layer, and the third layer are first deposited over the test pad and the magnetic layer and then selectively etched from the test pad.

19. The method of claim 18, wherein, after etching, the first layer extends beyond a perimeter of the magnetic layer; and wherein an interface area between the first layer and the magnetic layer is determined by a top surface of the magnetic layer.

20. The method of claim 1, wherein two or more of the first layer, the second layer, or the third layer are deposited using the high productivity combinatorial atomic layer deposition technique or the high productivity combinatorial physical vapor deposition technique.

* * * * *